(12) United States Patent
Ideler

(10) Patent No.: US 6,853,855 B2
(45) Date of Patent: Feb. 8, 2005

(54) MAGNETIC RESONANCE TOMOGRAPHY APPARATUS WITH IMPROVED SPATIAL AND TIME STABILIZATION OF THE HOMOGENEITY OF THE MAGNETIC BASIC FIELD

(75) Inventor: Karl-Heinz Ideler, Spardorf (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/191,817

(22) Filed: Jul. 9, 2002

(65) Prior Publication Data
US 2003/0025501 A1 Feb. 6, 2003

(30) Foreign Application Priority Data
Jul. 11, 2001 (DE) .......................... 101 33 655

(51) Int. Cl.[7] .............................................. A61B 5/055
(52) U.S. Cl. ...................... 600/410; 324/318; 324/320
(58) Field of Search ............................... 600/410, 407; 324/318, 320, 322

(56) References Cited

U.S. PATENT DOCUMENTS

| 5,786,695 A | 7/1998 | Amor et al. |
| 6,411,187 B1 * | 6/2002 | Rotem et al. ............... 335/296 |
| 6,529,005 B1 * | 3/2003 | Kasten et al. ............... 324/320 |
| 6,589,793 B1 * | 7/2003 | Appelt et al. ................. 436/73 |
| 6,598,404 B2 * | 7/2003 | Kruip ........................... 62/3.3 |
| 2001/0020546 A1 * | 9/2001 | Eldridge et al. ............ 174/261 |
| 2002/0179830 A1 * | 12/2002 | Pearson et al. ............. 250/250 |
| 2003/0105396 A1 * | 6/2003 | Eriksen et al. .............. 600/431 |

FOREIGN PATENT DOCUMENTS

GB    2 319 845    6/1998

OTHER PUBLICATIONS

Patent Abstracts of Japan Publication No. JP 2000037366, For Japanese Application 19980207664.
Patent Abstracts of Japan Publication No. 08 215168 A, Aug. 27, 1996 for Application No. 07/029,216.

* cited by examiner

Primary Examiner—Ruth S. Smith
(74) Attorney, Agent, or Firm—Schiff Hardin LLP

(57) ABSTRACT

A magnetic resonance apparatus has a basic field magnet for providing a uniform magnetic basic field, a gradient coil system for coding within the basic field as well as a passive shim system for homogenizing the magnetic basic field. This passive shim system is composed of shim iron plates that are placed in the magnetic basic field. A device is provided with which the temperature of these shim iron plates is controlled.

6 Claims, 5 Drawing Sheets

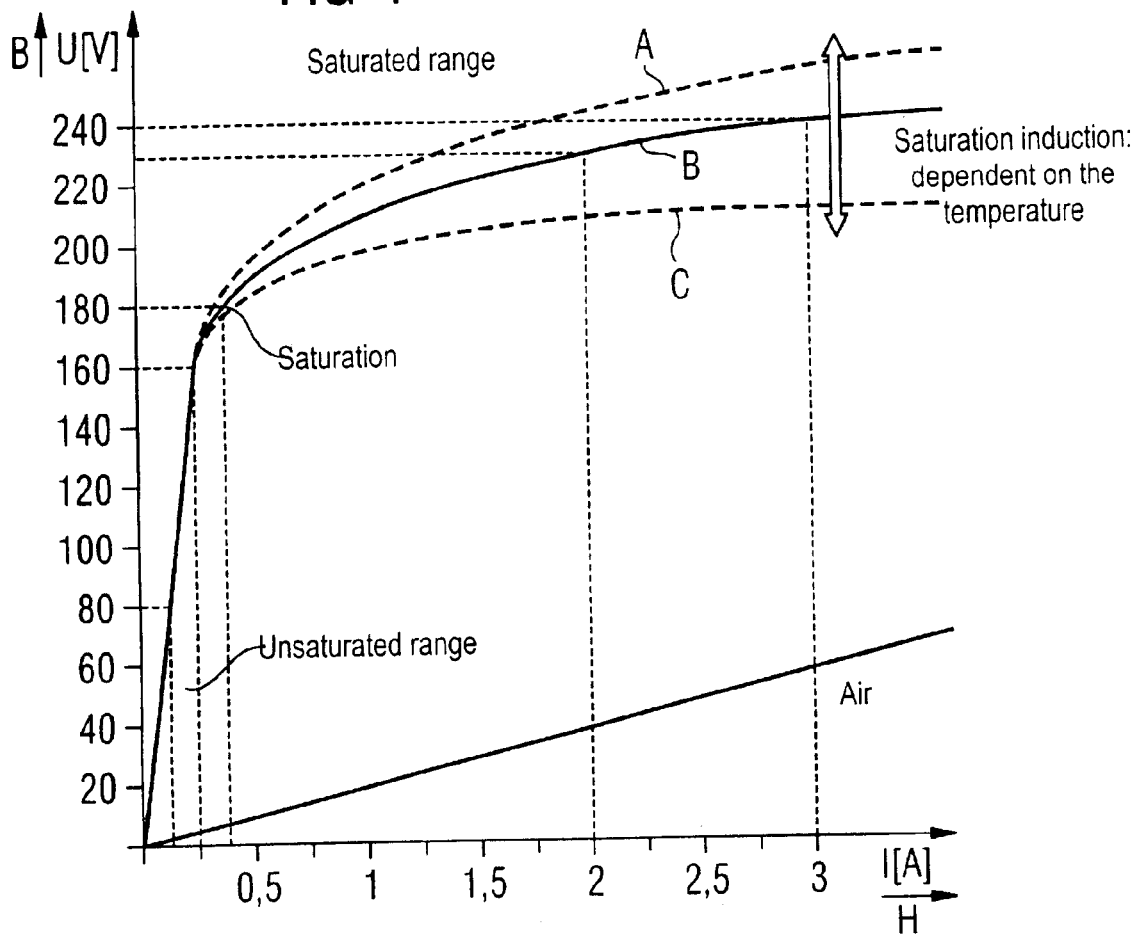
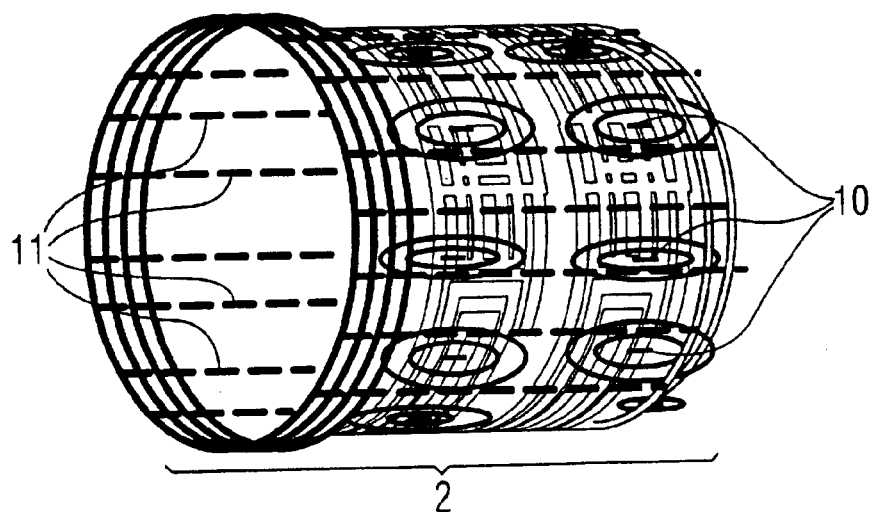

MAGNETIC RESONANCE TOMOGRAPHY APPARATUS WITH IMPROVED SPATIAL AND TIME STABILIZATION OF THE HOMOGENEITY OF THE MAGNETIC BASIC FIELD

BACKGROUND OF THE INVENTION

1. Field of the Invention

The present invention is directed in general to magnetic resonance tomography (MRT) as employed in medicine for the examination of patients. In particular, the present invention is directed to a magnetic resonance tomography apparatus of the type wherein the homogeneity of the magnetic basic field is stabilized or by components referred to as shim iron plates.

2. Description of the Prior Art

MRT is based on the physical phenomenon of nuclear magnetic resonance and has been utilized as an imaging method for more than fifteen years in medicine and biophysics. In this examination method, the subject is exposed to a strong, constant magnetic field. As a result, the nuclear spins of the atoms in the subject are aligned, these having been previously irregularly oriented. Radio-frequency waves can then excite these "ordered" nuclear spins to perform a specific oscillation. This oscillation generates the actual measured signal in MRT that is registered with suitable reception coils. By utilizing location-dependent magnetic fields generated by gradient coils, the signals from the examination subject can be spatially encoded in all three spatial directions. The method allows a free selection of the slice to be imaged, as a result of which tomograms of the human body can be registered in all directions. MRT as a tomographic method in medical diagnostics is mainly distinguished as a "non-invasive" examination method on with a versatile contrast capability. Due to the excellent portrayal of soft tissue, MRT has developed into a method that is often superior to x-ray computed tomography (CT). MRT is currently based on the application of spin echo and gradient echo sequences that, given measuring times on the order of magnitude of a few seconds, achieve an excellent image quality.

The on-going technical improvement of the components of MRT devices and the introduction of fast imaging sequences open more fields of application in medicine to MRT. Real-time imaging for supporting minimally invasive surgery, functional imaging in neurology and perfusion measurement in cardiology are only a very few examples.

The basic structure of one of the central parts of such a MRT apparatus as shown in FIG. 6. It has a basic field magnet 1 (for example, an axially superconducting air-coil magnet with active stray field shielding) that generates a uniform magnetic basic field in an interior space. The superconducting basic field magnet 1 is composed of superconducting coils in its interior that are contained in liquid helium. The basic field magnet 1 is surrounded by a two-shell vessel that is usually composed of stainless steel. The inner vessel that contains the liquid helium and also partly serves as winding member for the magnetic coils is suspended at the outer vessel, which is at room temperature, via Gfk rods with poor thermal conductivity. A vacuum exists between inner and outer vessel.

A cylindrical gradient coil arrangement 2 is concentrically introduced with carrier elements 7 into the interior of the basic field magnet 1 in the inside of a carrier tube. The carrier tube is limited toward the outside by an outer shell 8 and is limited toward the inside by an inner shell 9.

The gradient coil arrangement 2 has three partial windings that generate respective gradient fields that are proportional to the respective currents supplied thereto and that are spatially perpendicular to one another. As shown in FIG. 7, the gradient coil arrangement 2 has a x-coil 3, a y-coil 4 and a z-coil 5 that are respectively wound around the coil core 6 and thus generate respective gradient field, expediently in the direction of the Cartesian coordinates x, y and z. Each of these coils is equipped with its own power supply in order to generate independent current pulses in conformity with the sequences programmed in the pulse sequence controller that are exact both in terms of amplitude and time. The required currents lie at approximately 250 A. Since the gradient switching times should be as short as possible, current rise rates on the order of magnitude of 250 k A/s are necessary.

Since the gradient coil usually is surrounded by conductive structures (for example, magnet vessel of stainless steel), the pulsed fields create eddy currents in those structures that in turn interact with the basic magnetic field and vary it (i.e., they disturb its homogeneity).

In magnetic resonance tomography, however, the homogeneity of the basic magnetic field in the measurement volume is of basic significance.

Since the magnetic resonant frequency is directly dependent on the magnetic field strength, the same field strength should prevail in the defined measurement volume at every point in this volume. This is critical for the spatial resolution in imaging and for the reproducibility of frequency spectra in spectroscopic exams wherein field distortions caused by the susceptibility of the examination subject must be re-corrected.

Three different techniques are known for homogenization of the basic magnetic field (referred to below as shimming):

1. The three coils that are orthogonal to one another in the gradient coil 2 (FIG. 5, FIG. 7) for generating the gradient fields or for encoding the measurement volume are charged with offset currents in order to compensate field inhomogeneities of the first order.

2. A further, current-permeated orthogonal coil system with which it is likewise possible to homogenize the basic magnetic field is located within this gradient coil 2. these additional correction coils 10 (shim coils) (FIG. 5) thereby serves the purpose of compensating inhomogeneities of a higher order and therefore have an extremely complicated structure.

3. For homogenization of the basic magnetic field, a suitable arrangement of iron plates 11 referred to as shim iron plates (FIG. 5) is attached in the magnetic bore, i.e. within the gradient coil or between coil and basic field magnet. The locations where the plates 11 are attached are calculated with a field calculating program. A prior measurement of the field distribution serves as a prescription for the calculation. After assembly, a monitoring measurement is also implemented. This procedure must be multiply repeated before a satisfactory shim result has been achieved.

The first and second techniques represent an active shimming, the third technique is referred to as passive shimming. As a rule, a cooling water system is present for cooling the shim coils and shim iron plates.

Nonetheless, the overall condition for which shimming is needed is subject to different fluctuations due to changes in various physical parameters, thus inhomogeneities in the basic magnetic field still can arise both in terms of time and location.

SUMMARY OF THE INVENTION

It is an object of the present invention to improve the spatial and time stabilization of the basic field homogeneity during the operation of a MRT apparatus.

This object is inventively achieved in magnetic resonance apparatus having a basic field magnet for providing a uniform magnetic basic field, a gradient coil system for coding within the basic field as well as a passive shim system serving the purpose of homogenization of the magnetic basic field, this passive shim system including shim iron plates that are placed in the magnetic basic field, and a device with which the temperature of these shim iron plates is controlled.

This has the advantage that temperature fluctuations in the system are compensated, for example due to varying dissipated power within the gradient coil arrangement due to the eddy currents within the shim iron plates or due to the temperature of the coolant.

By means of such a device, thus, the temperature of the individual shim iron plates can be stabilized, which likewise has a stabilizing effect on the magnetic basic field.

In exactly the same way, such a device allows a designational tempering of the shim iron plates, and thus a fine optimization of the magnetic basic field.

The temperature control of the shim iron plates ensues with heating coils or Peltier elements.

If heating coils are employed for temperature control, these must be designed such that the creation of a magnetic field due to a parallel paths of the forward and return conductors as well as by means of a suitable current supply is avoided.

The shim iron plates are mounted on non-magnetic, thermally conductive material at the opposite side of which the heating coil or Peltier element is located.

If Peltier elements are employed for the temperature control, the temperature control is composed of a bridge circuit that has four transistors, two operational amplifiers and the Peltier element. This temperature control is driven by a conventional temperature-regulating circuit.

The drive of the temperature-regulating circuit can ensue via a by means of a digital-to-analog converter as well.

The transistors of the temperature control are inventively placed such that they promote the thermal action of the Peltier elements.

This can be accomplished by mounting the two transistors that are charged with current when heating the shim iron plates such that they are in thermal contact with the shim iron plates to be heated.

The device for temperature control can be fashioned such that the temperature of each shim iron plate can be individually controlled.

DESCRIPTION OF THE DRAWINGS

FIG. 4 shows the magnetic saturation induction dependent on the temperature.

FIG. 5 schematically shows a gradient coil system for cylindrical basic field magnets with integrated shim, coils and geometrically distributed shim iron plates.

DESCRIPTION OF THE PREFERRED EMBODIMENTS

Figure 1A:
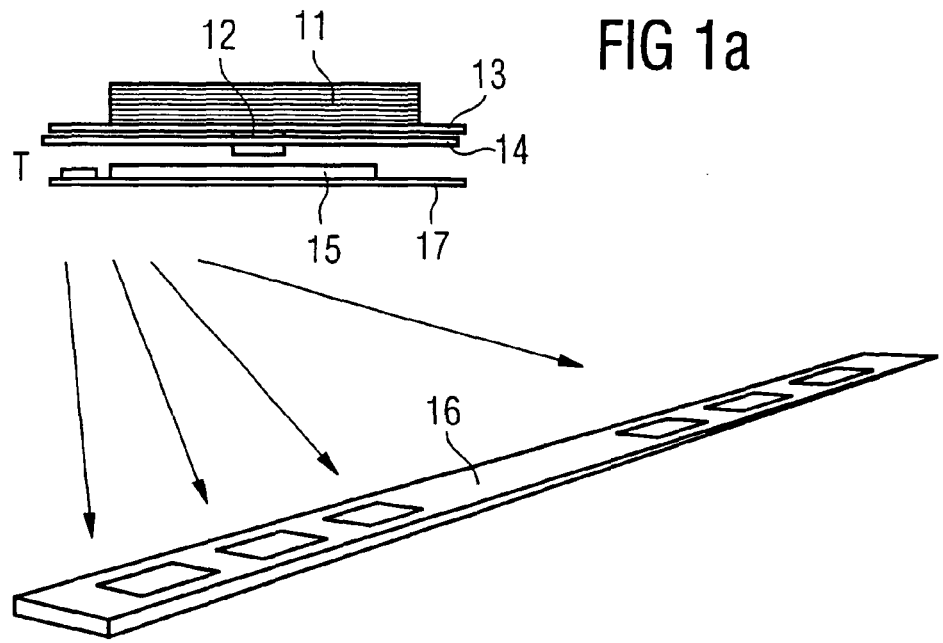
FIG. 1a shows a temperature-regulated, mechanical-electrical unit of a shim-iron plate and the implementations thereof in a thermally and electrically non-conductive carrier rail, in accordance with the invention.

FIG. 1a shows a temperature-regulated mechanical-electrical unit of a shim iron plate 11. The shim iron plate 11 is mounted on a non-magnetic, thermally conductive plate 13 (thermal spread, for example aluminum) with an electrically heatable coil 14 attached at the opposite side. A temperature sensor 12 in thermal contact with the thermally conductive plate 13 is located at the same side as the coil. The control electronics 15 for the heating coil drive is attached on a further plate 17 thermally isolated from the thermally conductive plate 13. The plate 13 or the plate 17 can, for example, be held at a thermally insulating distance with stud bolts, plug pins or casting.

The mechanical-electrical unit shown in FIG. 1a represents a single heatable shim iron plate. For homogenization of the magnetic basic field, a number of these units are then introduced into a thermally and electrically non-conductive carrier rail 16 (usually an injection molded part of, for example, Gfk). The introduction of a number of these units on a number of carrier rails 16 forms the passive shimming (see FIG. 5).

Figure 1B:
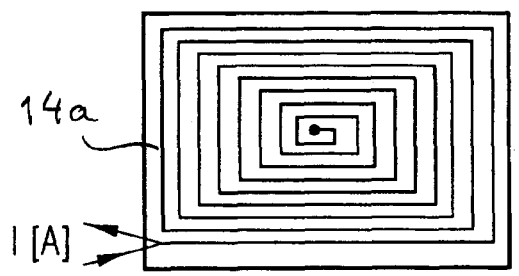
FIGS. 1b and 1c show two embodiments of the heating coils in a plan view.
Figure 1C:
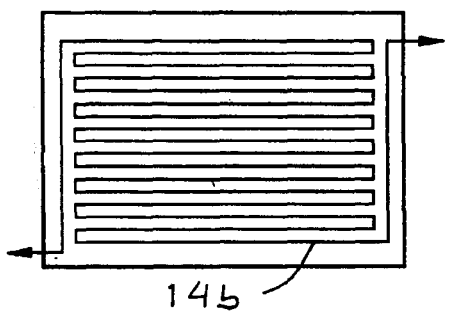

FIGS. 1b and 1c respectively show two embodiments of the heating coil. It is important that the individual heating coils are designed such that the creation of an external magnetic field due to parallel guidance of the forward and return conductors is avoided. This is likewise true for the power supply. In the spiral embodiment 14a of FIG. 1b, the heating wire is thus composed of two wires, the power lead-in and the power lead-out. In the serpentine embodiment 14b of FIG. 1c, a single wire is used.

Figure 1D:
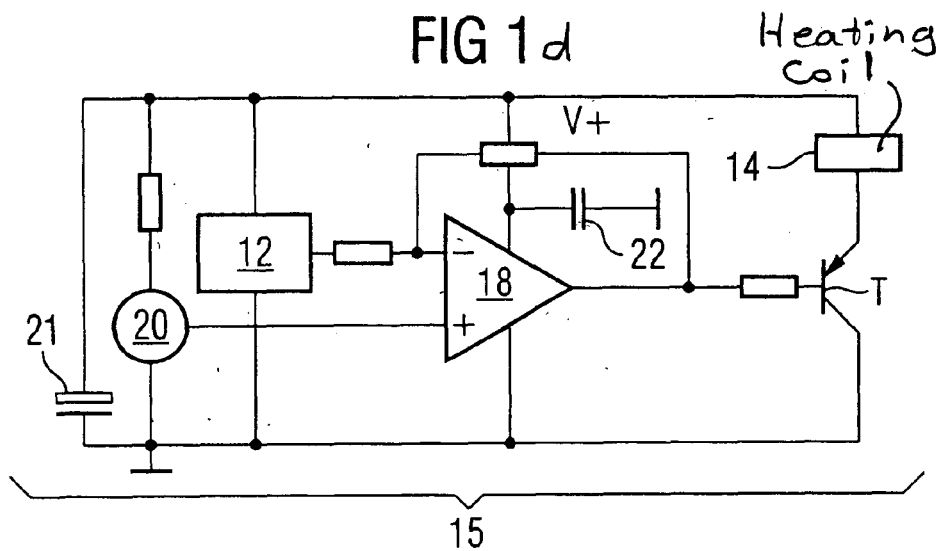
FIG. 1d shows an embodiment of the temperature regulation of the heat conductor means of temperature sensor.

FIG. 1d shows an embodiment of the control electronics 15. The temperature difference is supplied to an operational amplifier 18 via the voltage value of the temperature sensor 12 corresponding to the current temperature and a reference value established by a reference voltage 20. The amplified signal at the output of the operational amplifier 18 drives the transistor T beginning with a minimum difference voltage. The heating coil 14 is then kept under power until the temperature difference in the form of a voltage difference between 12 and 20 drops below a minimum value. Since this control circuit is exposed to the radio-frequency fields in the inside of the magnetic resonance tomography apparatus, for example, it must be attenuated by an electrolytic capacitor 21. The capacitor 22 is a supporting capacitor and serves the purpose of stabilizing the supply voltage of the operational amplifier.

Figure 2A:
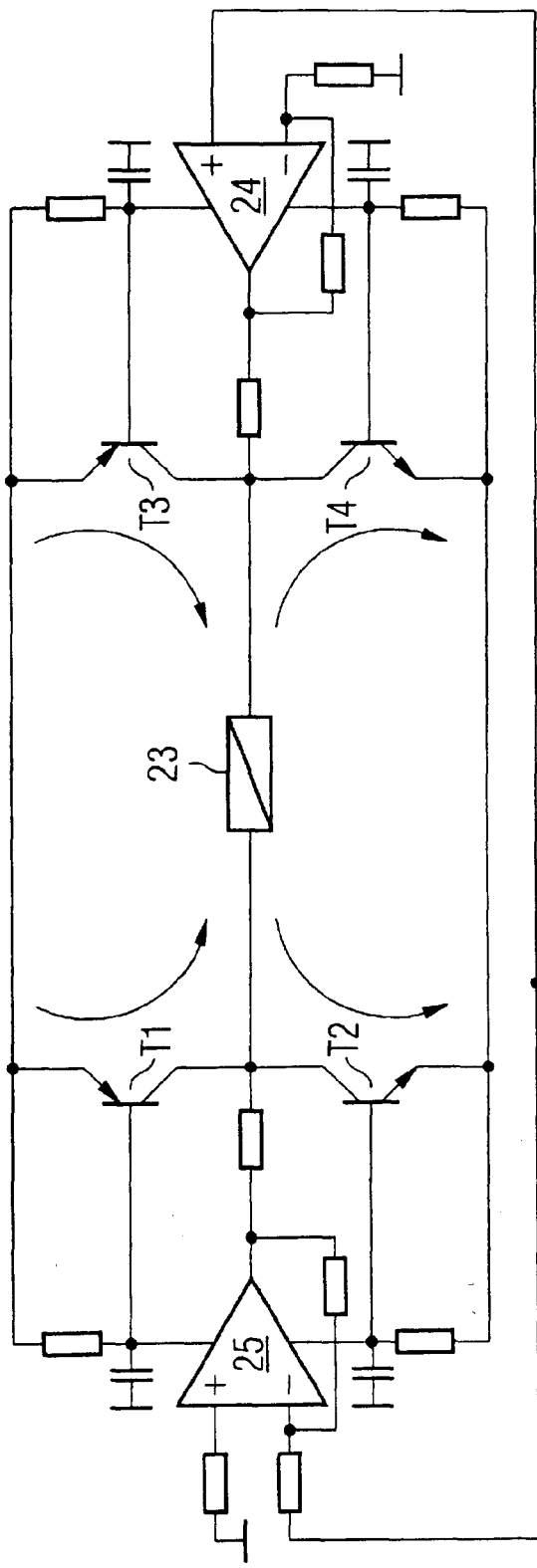
FIG. 2a shows the inventive implementation of the temperature regulation with a Peltier element.

FIG. 2a shows the inventive execution of the temperature control by means of a Peltier element 23. The advantage compared to the temperature control with heating coils is that the shim iron plates can be cooled as well as heated with Peltier elements. The temperature stabilization requires less energy and reacts significantly faster, generally in the range of seconds. The Peltier elements are also not negatively influenced by the basic magnetic field.

The Peltier element drive ensues via a bridge circuit composed of two operational amplifiers 24, 25, two pnptransistors T1, T3 as well as two npn-transistors T2, T4. The regulating value $U_{regulating}$ is delivered to the bridge circuit by the circuit 26, which is constructed similar to the control electronics 15 in FIG. 1c. Different from FIG. 1d, the output value $U_{regulating}$ of the operational amplifier 18 in FIG. 2a serves as control value for the bridge circuit. Dependent on whether the output value of the temperature sensor 12 lies below (too cold) or above (too warm) the reference value of the reference voltage 20, $U_{regulating}>0$ or, respectively, $U_{regulating}<0$ apply.

When $U_{regulating}<0$ applies, the output voltage of the operational amplifier 24 is negative, T3 is driven, T4 is inhibited. In contrast thereto, the output voltage of the operational amplifier 25 is positive, T2 is driven, T1 is inhibited.

Figure 2B:
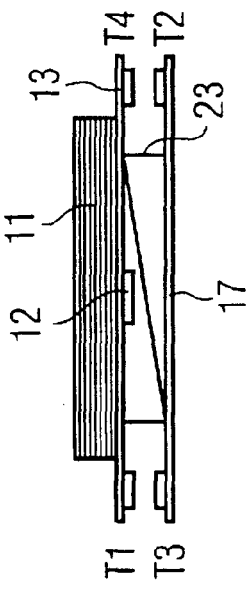
FIG. 2b shows a temperature-regulated, mechanical-electrical unit of a shim-plate.

As shown in FIG. 2b, the Peltier element 23 is arranged such that it cools the thermally conductive plate 13 and, thus, the shim iron plate 11 when the transistors T1, T4 are inhibited and the transistors T3, T2 are conductive.

When $U_{regulating}>0$ applies, the output voltage of the operational amplifier 24 is positive, T4 is driven, T3 is inhibited. In contrast thereto, the output voltage of the operational amplifier 25 is negative, T1 is driven, T2 is inhibited.

In this case, the Peltier element heats the thermally conductive plate 13, and thus the shim iron plate. As can be seen from FIG. 2b, the current-carrying transistors T1, T4 during heating are inventively mounted on the thermally conductive plate 13 and thus promote the thermal influence of the Peltier element by developing their own heat.

Figure 3:
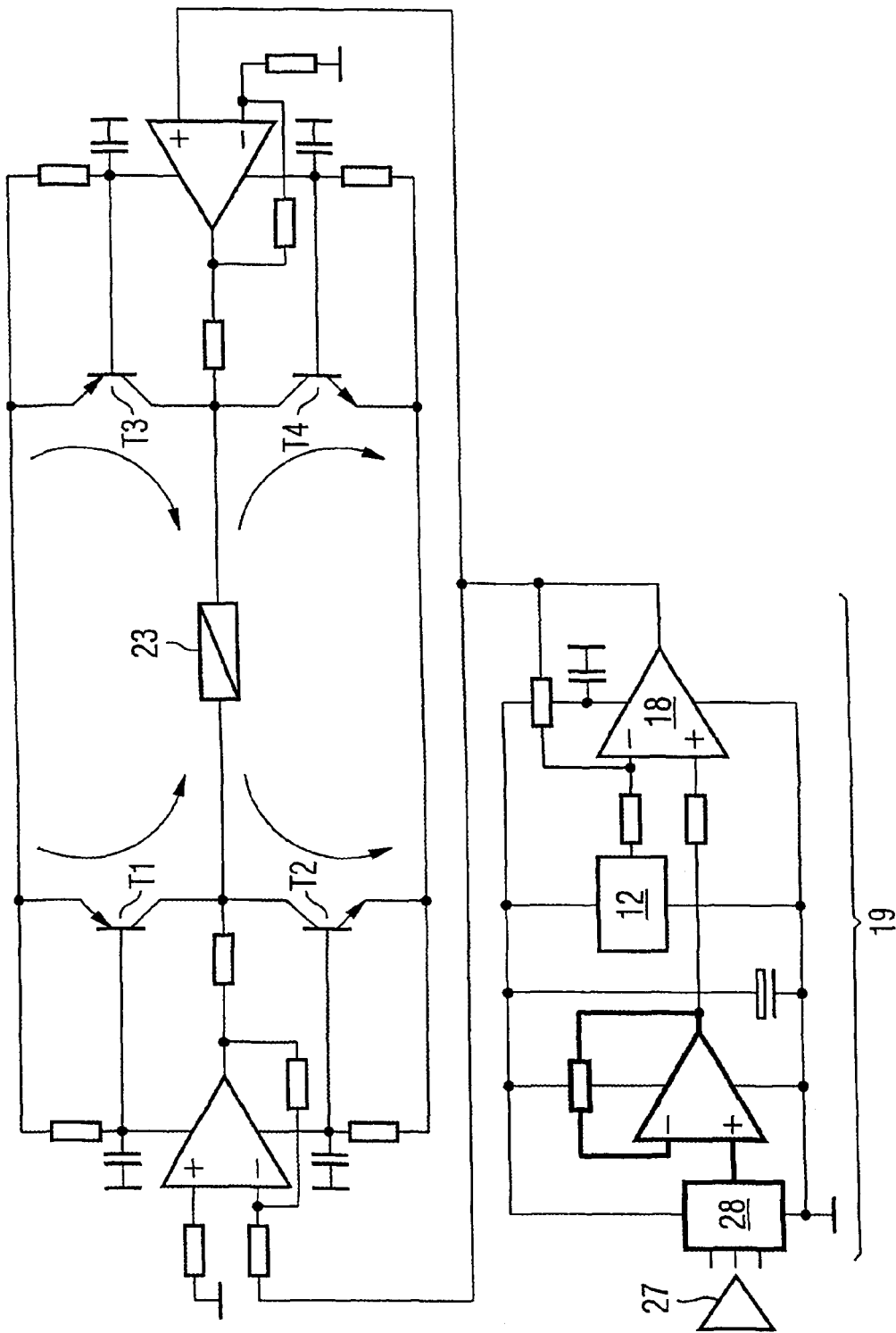
FIG. 3 shows the inventive implementation of the temperature regulation by means of Peltier element via a digital-to-analog converter.
Figure 6:
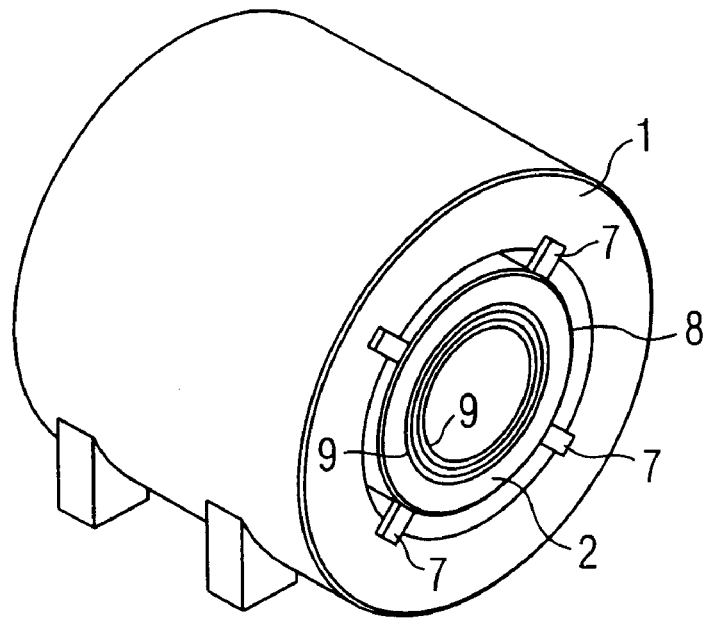
FIG. 6 shows a perspective illustration of the basic field magnet.
Figure 7:
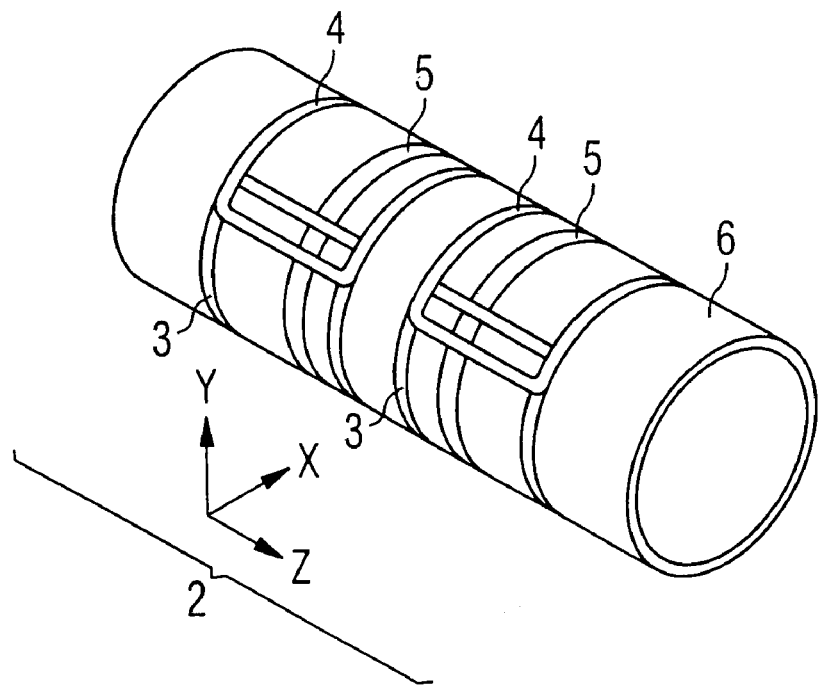
FIG. 7 shows a perspective illustration of the gradient coil with the three partial windings.

FIG. 3 shows the inventive embodiment of the temperature control by means of Peltier element that can be separately driven via a digital-to-analog converter. The illustrated bridge circuit in FIG. 3a is identical to that in FIG. 2a. The circuit 19 is also similarly constructed like the control electronics 15 in FIG. 1c or the circuit 26 in FIG. 2a, with the difference that the reference value of the temperature of the thermally conductive plate 13, and thus of the shim iron plate 11 can be digitally prescribed to a digital-analog-converter 28 (DAC) via a bus 27. A 4 through 8-bit DAC is adequate as integral component part of the individual drive circuits. The mechanical-electrical units thus can be separately driven, and thus the shim-iron plates 11 can be individually temperature-controlled. As a result thereof, a fine adjustment of the shim condition is possible, as shall be explained in greater detail below.

FIG. 4 shows the magnetic saturation induction dependent on the temperature. The induction of a ferromagnetic material (for example, NiFeCu ferrite) reaches a saturation value (curve B) in a magnetic field H. This is dependent on the temperature. At a higher temperature, the saturation value decreases (curve C); it increases at a lower temperature (curve A).

This means that the saturation induction is subject to a drift given a temperature variation of the material, particularly of the shim iron plates, this drift causing a modification of the shim condition and, thus, a deterioration of the homogeneity of the magnetic basic field. Such temperature variations can, for example arise due to fluctuations in the coolant circulation, mentioned above.

A temperature stabilization with a heating coil or Peltier element according to the present invention prevents a change of the saturation induction—assuming the control temperature of the shim iron plate lies below the Curie temperature at which the magnetic property of a ferromagnet begins to fail.

The temperature dependency of the saturation induction of the shim iron plate of FIG. 4 has a further advantage. By means of designational, individual temperature-control (cooling, respectively, heating) of the individual shim iron plates, the temperature-dependency of the saturation induction can be utilized in order to undertake a further fine optimization (fine tuning) after iterative optimization of the homogeneity of the magnetic basic field (passive shim, see above). This is even possible during operation.

The advantages are:
clearly better image quality, particularly in functional MRT as well as spectroscopy;
significantly lower demands made of the coolant circulation (reduction of the flow-through amount, cost-savings);
selective optimization of the homogeneity of the magnetic basic field in the examination volume of interest;
fewer iterations in the passive shim, i.e. shorter installation times.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a basic field magnet which generates a uniform basic magnetic field;
   a gradient coil system for encoding signals within said basic magnetic field;
   a passive shim system having a plurality of shim iron plates disposed to interact with said basic field magnet to homogenize said basic magnetic field; and
   a thermal control device comprising a bridge circuit containing transistors, operatonal amplifiers and a Peltier element in thermal communication with at least one of said shim iron plates, and a temperature regulating circuit, connected to said bridge circuit, for generating an output signal for regulating a temperature of said at least one of said shim iron plates, said output signal switching said transistors for selectively placing said Peltier element in one of an operating mode for elevating the temperature said at least one of the shim iron plates or a mode for decreasing the temperature said at least one of the shim iron plates.

2. A magnetic resonance apparatus as claimed in claim 1 wherein said temperature control device stabilizes the temperature of said at least one of said shim iron plates.

3. A magnetic resonance apparatus as claimed in claim 1 wherein said temperature control device homogenizes said basic magnetic field by causing said at least one of said shim iron plates to exhibit a targeted temperature.

4. A magnetic resonance apparatus as claimed in claim 1 wherein said at least one of said shim iron plates is mounted on a non-magnetic, thermally conductive plate at a first side thereof, and wherein said Peltier element is mounted at a second side of said thermally conductive plate, opposite to said first side.

5. A magnetic resonance apparatus as claimed in claim 1 wherein said temperature control device comprises a databus on which a digital drive signal is supplied for said temperature regulating circuit, and a digital-to-analog converter connected between said databus and said temperature regulating circuit.

6. A magnetic resonance apparatus as claimed in claim 1 wherein a first pair of said transistors in said bridge circuit are charged with current for elevating a temperature of said at least one of said shim iron plates and are mounted in thermal contact with said at least one of said shim iron plates.

* * * * *